United States Patent [19]

Albano et al.

[11] Patent Number: 5,579,212

[45] Date of Patent: Nov. 26, 1996

[54] PROTECTIVE COVER FOR A SILICON CHIP DEVICE AND METHOD RELATING THERETO

[75] Inventors: Daniel Albano, Carlisle; Robert S. Antonuccio, Burlington, both of Mass.; William A. Izzicupo, Windham; Mario N. Palmeri, Jr., Nashua, both of N.H.

[73] Assignee: Sun Microsystems, Inc., Mountain View, Calif.

[21] Appl. No.: 410,007

[22] Filed: Mar. 22, 1995

Related U.S. Application Data

[63] Continuation of Ser. No. 99,292, Jul. 29, 1993, abandoned.

[51] Int. Cl.[6] ....................................................... H05K 7/12
[52] U.S. Cl. ..................... 361/820; 174/52.1; 257/678; 257/704; 257/726; 257/727; 361/748; 361/760; 361/807; 361/809
[58] Field of Search ............................... 174/52.1, 52.4; 206/328, 330–334; 257/678, 704, 726, 727, 796, 731, 778; 361/760, 748, 783, 690, 748, 807, 805, 808, 810, 820; 435/68; 437/209

[56] References Cited

U.S. PATENT DOCUMENTS

| 3,297,974 | 1/1967 | Pittman | 439/331 |
| 3,335,327 | 8/1967 | Damon et al. | 206/328 |
| 3,523,608 | 5/1969 | Miller | 206/330 |
| 4,019,099 | 4/1977 | Calabro | 361/802 |
| 4,393,437 | 7/1983 | Bell et al. | 361/690 |
| 4,696,526 | 9/1987 | Newton et al. | 174/52.4 |

FOREIGN PATENT DOCUMENTS

| 2652227 | 3/1991 | France | 439/607 |
| 3335530 | 4/1985 | Germany | 361/752 |
| 3701310 | 7/1988 | Germany | 257/727 |
| 58-184744 | 10/1983 | Japan | 257/693 |
| 59-36946 | 2/1984 | Japan | 257/796 |
| 1-81255 | 3/1989 | Japan | 437/209 |
| 3-219660 | 9/1991 | Japan | 361/749 |
| 4-186790 | 7/1992 | Japan | 361/808 |

*Primary Examiner*—Donald A. Sparks
*Attorney, Agent, or Firm*—Matthew C. Rainey

[57] ABSTRACT

There is disclosed a cover for protecting the leads extending between a silicon chip device and an associated printed circuit board and their electrical connections with the board. The cover is formed out of clear plastic allowing inspection of the chip device and has several legs for securing and maintaining the cover on the board and has openings that allow for cooling of the chip device.

19 Claims, 2 Drawing Sheets

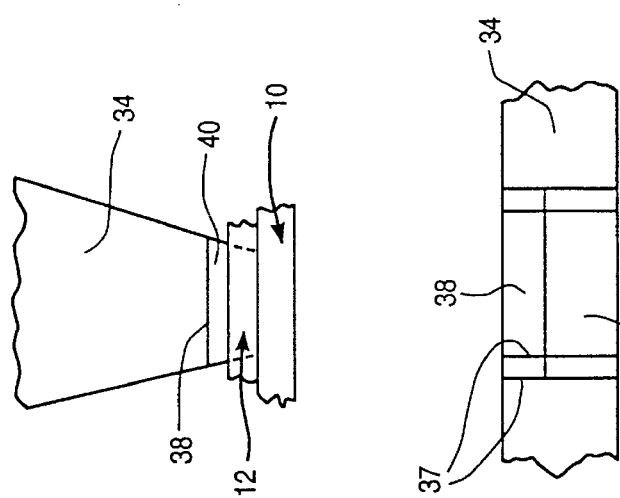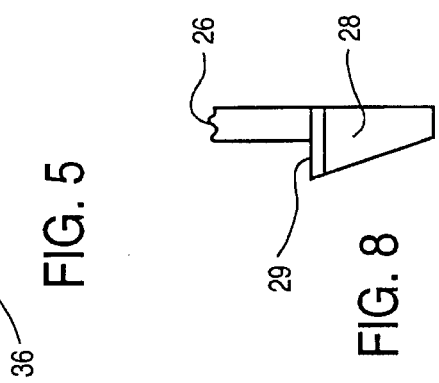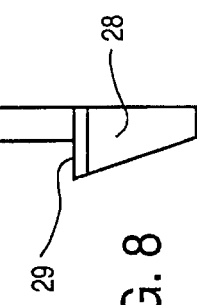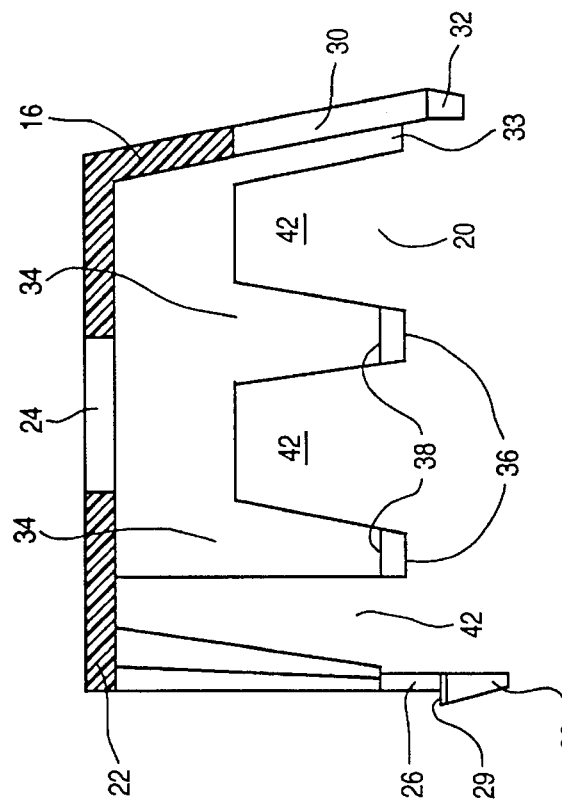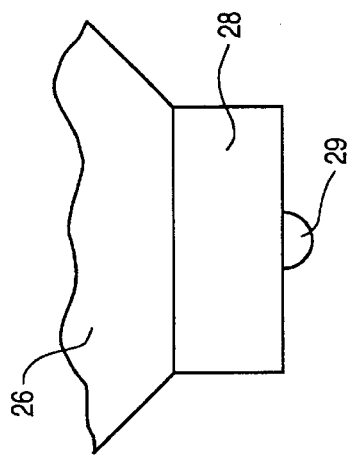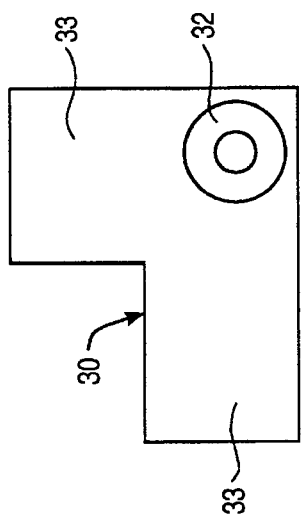

PROTECTIVE COVER FOR A SILICON CHIP DEVICE AND METHOD RELATING THERETO

This is a continuation of application Ser. No. 08/099,292, filed Jul. 29, 1993, now abandoned.

BACKGROUND OF THE INVENTION

The present invention relates to a cover for protecting a silicon chip device, such as a silicon chip device made up of a special packaging, for example, one involving tape automated bonding (TAB) for a central processing unit (CPU) chip used in a workstation system and a method of assembling the cover over the chip device and on a printed circuit board (PCB).

The packaging of TAB chip devices have cost and performance benefits in certain cases over commonly employed through hole and surface mounted packaging and are very desirable for certain special high performance, density and power chips, which have a very high number of leads arranged extremely closely adjacent each other. The use of tape automated bonding, however, makes it highly desirable, if not necessary in certain cases, to protect the very fragile leads that run from the body of the chip device to the printed circuit board and the lead connections with the board.

This protection is desirable during processing of the TAB chip device after the chip device has been secured to its board. In providing such protection in the form of an attachable cover member the design must allow for cooling of the chip device, permit easy removal for reworking of the chip device, be quickly and securely mountable and removable, require no soldering for securement to the printed circuit board, and allow easy visual inspection of the chip device from above the device.

BRIEF SUMMARY OF THE INVENTION

The present invention has for its object providing a protective cover of the above noted type and kind capable of carrying out each and every one of the identified objectives.

More particularly, the present invention provides a protective cover for a silicon chip device, the cover having a protective side for each lead side of the chip device and a covering surface for protecting the device from the sides and above from inadvertent outside contact. The sides of the cover provide at least two opposed attachment legs with outer ends that pass through openings provided in the printed circuit board that allow the cover to be secured and operatively fixed to the board in a manner that resist dislodging therefrom.

Still more particularly, the present invention provides a protective cover for a silicon chip device which in addition to the above noted characteristics, is provided with two attachment legs arranged at diametrically opposed corners of the cover and two diametrically opposed registering legs at two other corners, the outer or lower ends of both sets of legs passing into cooperative openings formed in the printed circuit board, several additional legs make up portions of the sides of the cover having notched flat end surfaces for contacting the upper surface of the printed circuit board and over hanging the outer ends of the leads of the chip device.

The cover is made out of a clear plastic to allow quick visual inspection of certain aspects of the chip device and has a number of openings in its sides and top surface to permit cooling of the chip device when mounted over the chip device and secured to the board.

Another object of the present invention is to provide a method of assembling a printed circuit board with a silicon chip device and a cover for protecting the board and chip device, and particularly the leads of the chip device and their electrical connections with the board.

BRIEF DESCRIPTION OF THE DRAWINGS

The above objects and advantages of the invention and others will be better understood when the following description of the preferred embodiment of the invention is read along with the accompanying drawings of which:

FIG. 3 is a sectional view taken on lines 3—3 of FIG. 1 of the protective cover illustrating the construction of one of its protective sides, including one each of its attachment tension legs, registering legs and compression legs, FIG. 4 is an enlarged view of a portion of FIG. 3 showing the over hanging relationship of one of the compression legs of the cover relative to the ends of the leads on one side of the chip device shown in FIG. 1, FIG. 5 is an enlarged partial plan view viewed upwardly from the bottom of a portion of one of the compression legs of the cover shown in FIG. 3, FIG. 6 is an enlarged partial plan view viewed upwardly from the bottom of a portion of one of the registry legs of the cover shown is FIG. 3, and FIGS. 7 and 8 are enlarged partial plan and elevational views, respectively, FIG. 6 being viewed downwardly of the lower portion of one of the tension legs of the cover shown in FIG. 3.

DETAIL DESCRIPTION OF THE INVENTION

Figure 1:
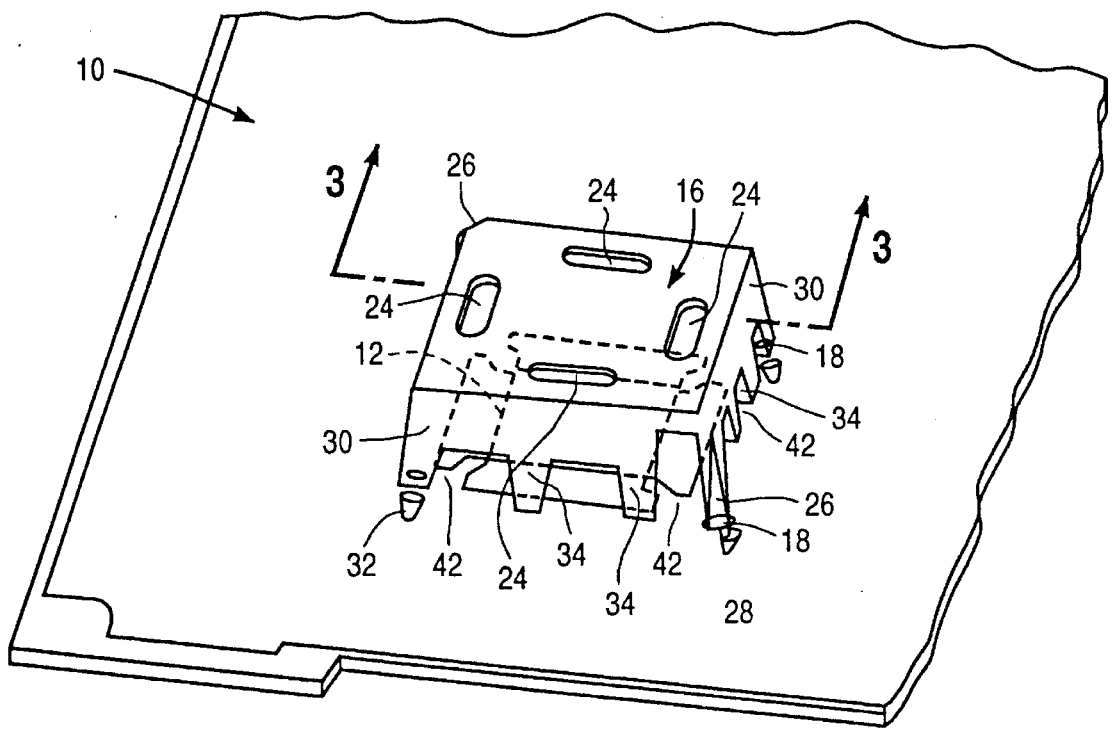
FIG. 1 is a perspective schematic view of a protective cover constructed in accordance with the teaching of the present invention shown mounted on a printed circuit board over a TAB chip device.
Figure 1A:
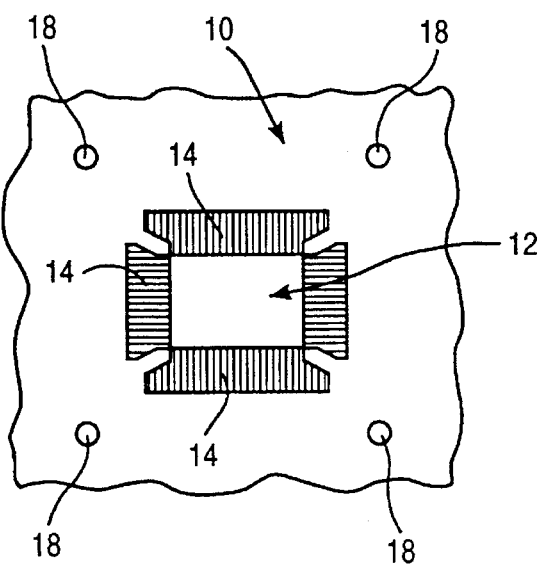
FIG. 1A is an enlarged prospective view of a portion of one of the tension legs and of the PCB.
Figure 2:
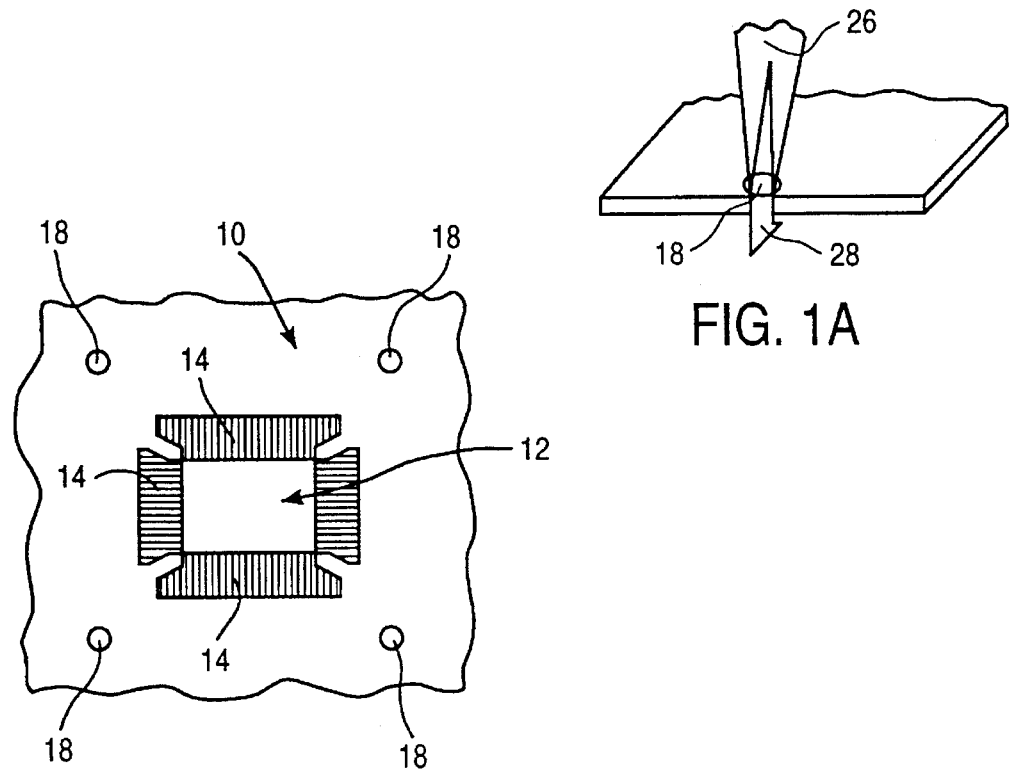
FIG. 2 is a schematic plan view of the chip device shown in FIG. 1, indicating its four sided lead construction.

With reference to FIG. 1 there is illustrated a portion of a PCB 10 having a CPU silicon chip device 12 of the type used in a well known workstation unit, not shown. The chip device 12, shown in schematic form for clarity in FIG. 2, is formed by a well known tape automated bonding packaging technic. In this technic instead of employing plastic or ceramic packaging it employs a tape carrier and involves the inner lead ends being bonded to the silicon of the chip device and the outer lead ends being soldered to the PCB. As indicated in FIG. 2, the chip device 12 consist of a large number of leads 14 of a lead frame, not shown, arranged extremely close to each other and for this reason, along with others, differs from other well known less miniatured chip devices. The TAB chip device 12 is secured to the PCB 10 by the tape carrier of the chip device.

In order to protect the leads 14 of the TAB chip device 12, including their connections with the PCB 10 from inadvertent outside contact, the present invention provides a cover 16 shown mounted on the PCB in FIG. 1. To receive the cover 16, the board 10 is provided with four identical circular holes 18 arranged outside but adjacent to the perimeter of the chip device 12, and particularly adjacent to the outer ends of the leads 14, as indicated in FIG. 1. In addition to the showing of the cover in FIG. 1, it is shown in greater detail in FIGS. 3 and 4. The cover 16 generally takes the form of a square shaped box with an open bottom 20 designed to surround the chip device 12 and protect its four lead sides from intrusion from the sides and from above. The closed top 22 of the cover is formed with four oblong holes 24, which along with openings provided in each of the four sides of the cover allow for cooling of the chip device 12.

The cover 16 is firmly secured to and held against movement or displacement from the PCB 10 by a series of three different sets of legs formed as an integral part of the one piece cover, with reference first to what may be referred to as tension legs, it will be noted in FIGS. 1, 1A, 3, 7 and 8 that at two diametrically opposite corners of the cover 16, relatively long thin vertical extending tension legs 26 are provided having hooked formed outer or lower ends 28, in which the open ends or outer portions of the hooks face away from the center of the cover. While the base portions of the tension legs 26 gradually widen as they extend into the top of the cover, their outer ends or hooked ends 28 narrow so that their hooked ends can be forced into two cooperative diametrically opposite holes 18 of the PCB 10.

The deflection characteristics of the tension legs 26 is such that in mounting the cover 16 on the PCB 10, the legs 26 can be deflected towards the center of the cover from their normal fixed positions, and once through the holes 18 the hooks 28 will automatically snap outwardly to the normal fixed positions. In this position the upper generally flat perpendicularly extending surfaces 29 of the hooks 28, shown in FIG. 7 to be generally circular, will on any upward movement of the cover engage with the planes underneath surface of the PCB 10 and prevent removal of the cover. The clearance between the legs and holes 18 in the area of the hooks require force passage of the hook portions of the legs but resist removal of the hooks from the board under any reasonable anticipated force. As such, to remove and replace the cover 16 the hooks 28 of an original cover are broken away from the board and replaced by a new cover.

A second set of cover legs are referred to as registry legs, two such legs 30 being provided at the two other diametrically opposite corners of the cover relative to the corners having the tension legs 26. As best shown in FIG. 3, these legs have relatively uniform thick or width extending portions from the top 22 of the cover 16 to its open bottom 20. At the outer or lower ends of the registry legs 30 they are formed with pin like ends 32 that loosely pass into and through two cooperative holes 18 of the PCB 10, thus given stability to the cover mounting and serving to resist any tendency of the cover 16 from rotating relative to the board 10. As best shown in FIG. 6, the upper most parts of the pins 32 where they become part of their respective legs 30 have flat base portions 33 that engage the board 10. This view also shows the circular shape of the pins.

The third set of cover legs are given the nomenclature of compression legs, in which each of the four sides of the cover 16 are provided with two such equally spaced apart legs identified in the drawings at 34. As in the case of the registry legs 30, the compression legs 34 are very sturdily constructed compared to the tension legs 26 and at their outer or lower ends, as best shown in FIGS. 3, 4 and 5 have relatively wide flat contact or abutment surfaces 36 provided to engage the adjacent planar top surface of the PCB, FIG. 4 showing the perpendicular relationship between one of the surfaces 36 and an associated leg 34. The hard lines 37 in FIG. 5 indicate the outer or upper extent of the taper of the legs 34.

As can be seen from FIG. 1, the cover 16 is sized and particularly the outer ends of its legs such that the outer ends of the legs are arranged closely adjacent to the outer ends of the leads 14 of the TAB chip device 12. The legs 26 and 30 being located at the corners of the cover avoid any interference with the leads 14, whereas as to the compression legs 34 such interference is avoided by providing notches 38 on the inside vertical surfaces of the legs 34, as best shown in FIG. 4, where while a portion of one of the legs is shown to overlap the leads 14 a clearance 40 is shown to exist between the leg and the leads.

The legs 34 act as downward force resistant members with respect to the PCB 10 as to any force that may be inadvertently applied from the top of the cover 16. The several generally vertical openings 42 provided between the legs 34 and between them and the other adjacent legs allow for additional cooling of the chip device. The board contacting surfaces 33 and 36 of the legs 30 and 34, respectively, have the same vertical lengths relative to the top 22 of the cover 16 that maintain the top parallel to the top surface of the printed circuit board 10.

Although the cover may take different shapes than a square shaped box and be made out of other materials that will afford one or more of the advantages of the present invention, the cover is preferably made out of clear i.e. transparent plastic such as a clear polycarbonate from which flows several advantages. One obvious one is the cost of producing an effective cover, in which as noted above because of its low cost on the occasion of requiring work on the CPU chip device 12, the tension legs 26 can be broken away from the cover 16 and the original cover replaced after the work is completed by a new cover. The clear plastic allows for visual and easy inspection of printed information usually provided on the outer top surface of the silicon chip device.

Utilizing the method of the present invention by the system manufacturer or assembler includes providing the PCB 10 with the proper location and size of holes 18 and mounting and electrically connecting the TAB chip device 12 on the PCB in accordance with the particular technic employed by the manufacturer or assembler. The cover 16 is then secured to the PCB after which the required or desired processing steps and testing can be conducted while the cover protects the leads 14 and their connections with the PCB.

In accordance with the provisions of the patent statutes, we have explained our invention in terms of its preferred embodiment, however, it will be readily understood by those skilled in the art to which the invention pertains that it may be practiced otherwise than illustrated and described.

We claim:

1. A cover securable to a PCB for protecting a silicon chip device previously mounted on the PCB, the chip device having at least one series of leads extending laterally outwardly from at least two of its sides and having electrical connections with the PCB, the cover having a cover portion, the cover having a first side projecting from said cover portion constructed to be adjacent to the connections of one of the lead sides, the cover having at least one additional side projecting from said cover portion, said first side being dimensioned to surround the leads of the one lead side of the chip device in a protective manner from outside contact when the cover is mounted on the PCB, said first side and said additional side each having legs extending from said cover portion to a base of the cover, said legs having facilities at their base ends for securing the cover to the PCB, the cover having other facilities extending from said cover portion, and said other facilities having lengths extending from said cover portion that are greater than the lengths said first and additional projecting sides extend from said cover portion for maintaining the cover outwardly from the chip device and out of contact with the chip device and leads of the one lead side.

2. A cover in accordance with claim 1, wherein said chip device is provided with series of leads on at least two of its sides, and wherein the cover comprises two other said sides and said cover portion, said sides and said cover portion joined together to form an integral generally box shaped unit having a generally open base, said sides making up two pairs of sides, and said sides of each pair arranged opposite each other to form said box unit constructed to protect the two lead sides of the chip device from intrusion from outside the chip device and from above the chip device.

3. A cover in accordance with claim 2, wherein each said sides and said cover portion include openings of sufficient dimension to permit air to pass from the outside of the cover into its interior for cooling the chip device.

4. A cover in accordance with claim 2, wherein said cover is made out of a plastic material having a transparent characteristic sufficient to allow visual inspection of the outer face of the chip device.

5. A cover according to claim 1, wherein said first side and said additional side each have second legs extending from said cover portion to said base of the cover, said first mentioned legs being constructed and arranged to engage a first planar side of the PCB to resist movement of the cover in one direction relative to the chip device, said second legs having abutment portions at their base ends constructed and arranged to engage a second planar side of the PCB and to resist movement of the cover in a direction different from said one direction relative to the chip device, and said second legs having lengths sufficient to maintain a clearance between said abutment portions and the chip device and leads when said cover portion is in said outward position.

6. A cover in accordance with claim 5, wherein said sides and said cover portion are joined together to form an integral generally box shaped unit having a generally open base, said sides making up two pairs of sides, said sides of each pair arranged opposite each other and constructed and arranged to form said box unit constructed to protect the two lead sides of the chip device from intrusion from outside the chip device and from above the chip device, said other facilities Of the cover further comprising third legs extending from said cover portion to said base of the cover, and said third legs having end portions at their base ends for locating the cover on the PCB when the cover is in said mounted position.

7. A cover in accordance with claim 6, wherein said end portions at the base of said third legs are formed as registry pins at the extreme base ends of said third legs.

8. A cover in accordance with claim 5, wherein the cover comprises two said one sides and two said additional sides and said cover portion, said sides arranged to form two pairs of sides, said sides and said cover portion joined together to form an integral generally box shaped unit having a generally open base, one said side of each pair arranged opposite the other side of an associated pair to form said box unit constructed to protect the two lead sides of the chip device from intrusion from outside the chip device and from above the chip device, said abutment portions at the base ends of said second legs are formed with flat surfaces arranged generally perpendicularly of the longitudinal axis of said second legs, and said flat surfaces being sufficient in areas to engage the PCB to effect said resistance to movement.

9. A cover in accordance with claim 8, wherein the cover further comprises third legs extending from said cover portion to said base of the cover, said third legs having pin portions at their said base ends for registering the cover with the PCB when the cover is in said mounted position, said third legs at their base ends having flat surfaces arranged to engage the PCB, and said flat surfaces of said second and third legs having lengths substantially equal relative to said cover portion.

10. A cover for protecting the leads of a silicon chip device previously mounted on a PCB and portions of an associated PCB to which the leads are electrically connected, in which the leads are arranged on at least two of the sides of the chip device, the cover comprising projecting sides corresponding in number to the lead sides of the chip device, said sides arranged adjacent a different lead side of the electrical connections of the leads, said projecting sides being joined by a cover portion of the cover, said projecting sides and said cover portion being dimensioned to surround the chip device, its leads and the electrical connections of the leads with the PCB in a protective manner from outside contact when the cover is in its mounted position relative to the chip device on the PCB, said sides having first legs extending from said cover portion to a base of the cover, said first legs having facilities at their base ends for securing the cover to the PCB and resisting movement of the cover in one direction relative to the chip device, said sides having second legs extending from said cover portion to said base of the cover, said second legs having abutment portions at their base ends for resisting movement of the cover in a direction different from said one direction relative to the chip device, said second legs having lengths sufficient to maintain a clearance between said abutment portions and the chip device and leads, the cover having other facilities extending from said cover portion, and said other facilities having lengths extending from said cover portion that are greater than the lengths said projecting sides extend from said cover portion for maintaining the cover outwardly from the chip device and out of contact with the chip device and leads.

11. A method of assembling a silicon chip device and a protective cover for protecting the leads of the silicon chip device and the electrical connections of the leads with a PCB when mounted on the PCB, the cover having lead protecting surfaces constructed to surround the sides and outer surface of the silicon chip device, the steps comprising:

forming several holes in the PCB adjacent to and outside the perimeter of the silicon chip device when mounted at a predetermined location on the PCB, mounting the silicon chip device at said predetermined location on the PCB with said leads of the silicon chip device electrically connected to the PCB, inserting in said holes legs formed on the cover in a manner that a cover portion of the cover is placed outwardly, from the silicon chip device with said protecting side surfaces extending from said cover portion, when so inserted causing said side surfaces of the cover to be positioned to protect the leads of the silicon chip device and the electrical connections by providing non-intrusive walls for the sides of the silicon chip device and a covering for its outer surface, causing said legs to engage the PCB in a manner to resist displacement of the cover from the PCB, forming on the cover facilities for maintaining said protecting side surfaces out of contact with the silicon chip device and leads, and forming said facilities with lengths extending from said cover portion that are greater than the lengths said protecting side surfaces extend from said cover portion.

12. A cover securable to a PCB for protecting a silicon chip device mounted on the PCB, the chip device having a series of leads on at least two of its sides extending laterally outwardly from and having electrical connections with the PCB, the cover comprising four sides and a distinct cover portion, said sides being dimensioned to surround the leads of the chip in a protective manner from outside contact when the cover is in its mounted position relative to the chip device on the PCB, said sides and said distinct cover portion joined together to form an integral generally box shaped unit with four corner having a generally open base, two of said sides arranged opposite each other and two others of said sides arranged opposite each other to form said box unit constructed to protect the two lead sides of the chip device from intrusion from outside the chip device and from above the chip device, two diametrical opposite said corners having first legs extending from said cover portion to a base of the cover, said first legs having facilities at their base ends for securing the cover to the PCB and resisting movement of the cover in one direction relative to the chip device, two other diametrical opposite said corners having second legs extending from said cover portion to said base of the cover, said second legs having abutment portions at their base ends for resisting movement of the cover in a direction different from said one direction relative to the chip device, said abutment portions at the base ends of said second legs being formed with flat surfaces arranged generally perpendicularly of the longitudinal axis of said second legs, and wherein said flat surfaces of said second legs each have notches arranged to overhang the electrical connections of the leads sufficient in size to avoid contact with the electrical connections.

13. A cover securable to a PCB for protecting a silicon chip device mounted on a first of two planar sides of the PCB, the chip device having at least two series of leads extending laterally outwardly from two of its opposite sides and having electrical connections with the PCB, the cover having four projecting sides constructed to be adjacent to the connections of the leads, said four sides joined by a cover portion and projecting therefrom, said sides being dimensioned to surround the leads of the chip device in a manner to protect the leads from outside contact when the cover is in its mounted position on the PCB surrounding the chip device, said cover portion being dimensioned to be superimposed above the chip device and the leads in a manner to protect the leads from outside contact when the cover is in its mounted position on the PCB above the chip device, said sides forming four corners, two diametrically opposite said corners having first legs extending from said cover portion to a base of the cover, each of said first legs having facilities at their said base ends for securing the cover to the PCB in a manner to resist the cover from being easily lifted off the PCB, said facilities of said first legs having surfaces for contacting said first of the PCB sides, two different diametrically opposite said corners having second legs extending from said cover portion to said base of the cover, said second legs having pin portions at their said base ends for registering the cover with the other Of the sides of the PCB when the cover is in its mounted position, said sides each having third legs extending from said cover portion to said base of the cover, said third legs having abutment portions at their said base ends having surfaces for contacting the other of the sides of the PCB for resisting movement of the cover beyond a predetermined point in a direction into the PCB, and said second legs having lengths, in relationship to said sides, that maintain said sides out of contact with the chip device and the leads.

14. A cover in accordance with claim 13, wherein the lengths of said first legs are such that on upward movement of the cover said facilities engage the PCB, and the lengths of said third legs are such that on downward movement of the cover said abutment portions contact the PCB.

15. A cover in accordance with claim 13, wherein said PCB includes openings for receiving a different one of said facilities, said PCB including contacting portions for engagement by a different one of said abutment portions, and said PCB including other openings for receiving a different one of said pin portions.

16. A cover in accordance with claim 13, wherein said second legs each have surfaces for contacting the PCB, said abutment portions of said third legs having surfaces for contacting the PCB, and said contacting surfaces of said second and third legs being spaced equal distance with respect to said cover portion.

17. A cover securable to a PCB for protecting a silicon chip device previously mounted on a first of two planar sides of the PCB, the chip device having series of leads extending laterally outwardly from at least two of its sides and having electrical connections with the PCB, the cover having a cover portion, the cover having four projecting sides constructed to be adjacent to the connections of the leads, and said sides constructed to project from and support said cover portion of the cover outwardly from the chip device when the cover is mounted on the PCB, said sides and said cover portion joined together to form an integral generally box shaped unit having a generally open base, two of said sides having first legs extending from said cover portion to a base of the cover, said first legs having facilities at their base ends for securing the cover to the PCB, two other of said sides having second legs extending from said cover portion to said base of the cover, said facilities of said first legs having surfaces for contacting the other side of the PCB for resisting movement of the cover in one direction relative to the chip device, said second legs having abutment portions at their base ends having surfaces for contacting the first of the PCB sides for resisting movement of the cover in a direction different from said one direction relative to the chip device, said sides formed into two pairs of sides and said sides of each pair arranged opposite each other, said sides dimensioned to surround the leads of the chip device constructed to protect the two lead sides of the chip device from intrusion from outside the chip device and from above the chip device when the cover is mounted on the PCB, the cover comprising third legs extending from said cover portion to said base of the cover, said third legs having end portions at their base ends having surfaces for contacting the first of the PCB sides for registering the cover with the PCB when the cover is in said mounted position, and said third legs having lengths, in relationship to said sides, that maintain said sides out of contact with the chip device and the leads.

18. A cover in accordance with claim 17, wherein said abutment portions at the base ends of said second legs are formed with flat surfaces arranged generally perpendicularly of the longitudinal axis of said second legs, said flat surfaces being sufficient in areas to engage the first side of the PCB to effect said resistance to movement, said end portions of said third legs having pin portions for effecting said registering of the cover, said third legs at their base ends having flat surfaces arranged to engage the first side of the PCB, and said flat surfaces of said second legs having lengths shorter than the lengths of said third legs relative to said cover portion.

19. A cover in accordance with claim 17, wherein said end portions at the base of said third legs are formed as registry pins at the extreme base ends of said third legs.

* * * * *